United States Patent [19]

Emmanuel

[11] 4,388,728
[45] Jun. 14, 1983

[54] SOFT X-RAY LITHOGRAPHY SYSTEM

[75] Inventor: Saurabh D. Emmanuel, Stamford, Conn.

[73] Assignee: The Machlett Laboratories, Incorporated, Stamford, Conn.

[21] Appl. No.: 962,446

[22] Filed: Nov. 20, 1978

[51] Int. Cl.³ .......................................... G03B 41/16
[52] U.S. Cl. .................................. 378/34; 378/14 D; 378/143; 430/967
[58] Field of Search ................ 75/175.5; 313/330, 59, 313/60; 250/492 A, 406, 492.1, 492.2; 29/579; 430/966, 967, 270

[56] References Cited

U.S. PATENT DOCUMENTS

| | | | |
|---|---|---|---|
| 2,730,637 | 1/1956 | Atlee | 313/59 |
| 3,679,927 | 7/1972 | Kirkendall | 313/59 |
| 3,710,162 | 1/1973 | Bougle | 313/330 |
| 3,743,842 | 7/1973 | Smith et al. | 250/492 A |
| 3,942,015 | 3/1976 | Huxley | 250/406 |
| 3,969,131 | 7/1976 | Fatzer et al. | 313/330 |
| 4,184,078 | 1/1980 | Nagel et al. | 250/492.2 |
| 4,185,202 | 1/1980 | Dean et al. | 250/492.2 |
| 4,215,192 | 7/1980 | Buckley | 430/270 |

FOREIGN PATENT DOCUMENTS

| | | | |
|---|---|---|---|
| 2213184 | 3/1972 | Fed. Rep. of Germany | 313/60 |
| 2440988 | 3/1975 | Fed. Rep. of Germany | 313/60 |

OTHER PUBLICATIONS

Hughes et al., "X-Ray Lithography Breaks the VLSI Cost Barrier," *Electronics*, Nov. 9, 1978, p. 103.
Fredericks et al., "X-Ray Resist Process," *IBM Technical Disclosure Bulletin*, vol. 19, No. 11, Apr. 1977.

*Primary Examiner*—Alfred E. Smith
*Assistant Examiner*—T. N. Grigsby
*Attorney, Agent, or Firm*—John T. Meaney; Joseph D. Pannone

[57] ABSTRACT

A soft X-ray lithography system including an X-ray tube having an evacuated and sealed-off envelope provided with an X-ray transparent window made of beryllium material and enclosing a rotatable anode target made of graphite material, the target having an annular sloped surface carrying a focal track layer made of titanium carbide material and having a focal spot area aligned with an electron emitting cathode to generate characteristic titanium K alpha X-rays which pass in a beam through the window, a mask aligned with the window and having transparent portions which transmit the beamed X-rays, and a workpiece, such as a semiconductor wafer, for example, having a surface coated with a photoresist film disposed in alignment with the mask to have selected portions of the film irradiated by the X-rays transmitted through the transparent portions of the mask.

14 Claims, 1 Drawing Figure

U.S. Patent  Jun. 14, 1983  4,388,728
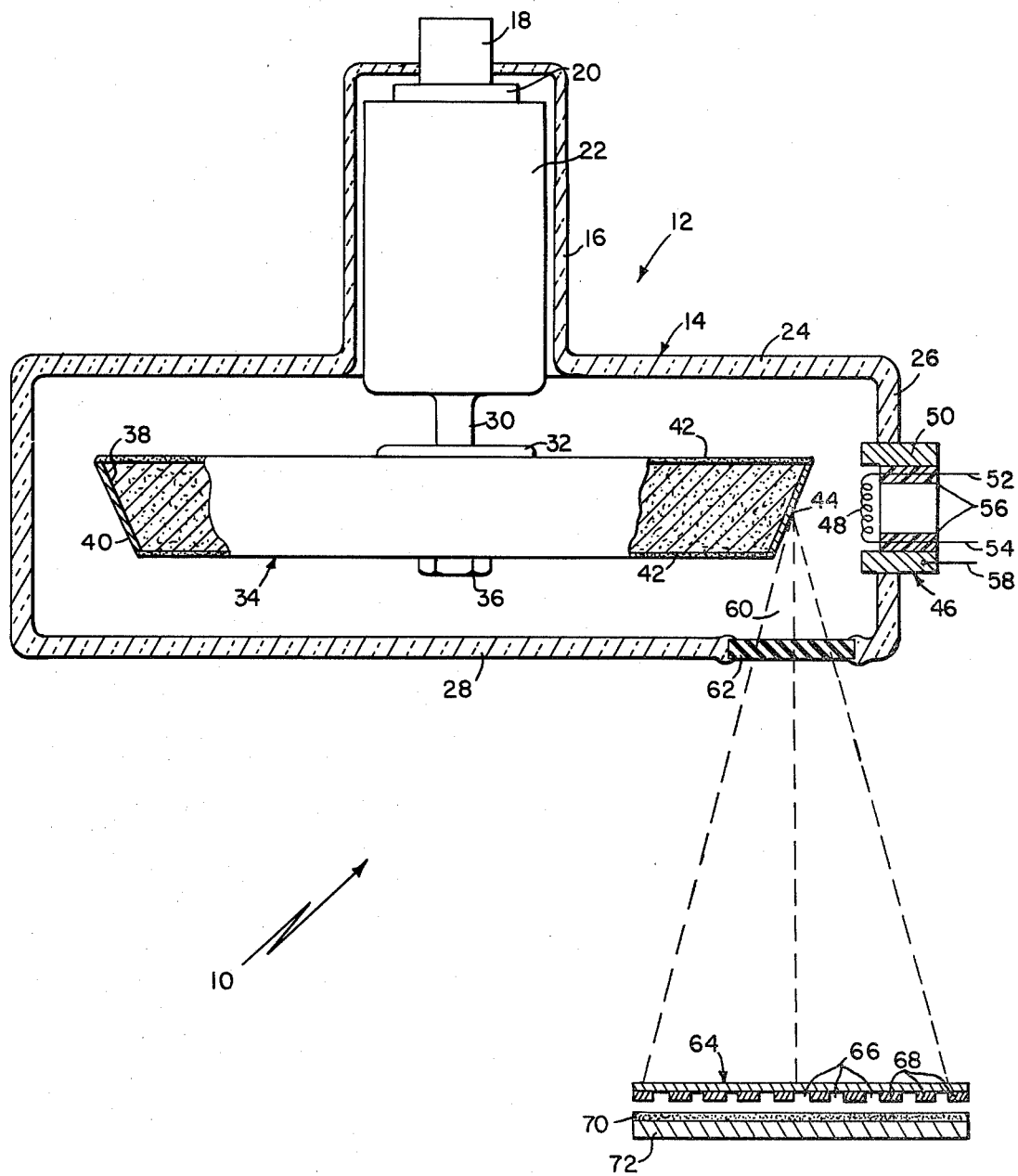

SOFT X-RAY LITHOGRAPHY SYSTEM

BACKGROUND OF THE INVENTION

1. Field of the Invention

This invention relates generally to soft X-ray lithography systems and is concerned more particularly with an efficient source of soft X-rays for photolithography.

2. Discussion of the Prior Art

In photolithography, a suitable radiation source generally is disposed for beaming radiation through transparent portions of a shadow mask and onto aligned portions of a photoresist film on a workpiece. Thus, in the manufacture of microelectronic devices, such as integrated circuit semiconductors, for example, ultraviolet light may be beamed through a pattern of transparencies in a mask to expose selected portions of a photoresist film on a surface of a semiconductor wafer. Subsequently, the wafer may be passed through a developer bath for removing either the exposed or the non-exposed portions of the photoresist film. As a result, the pattern of transparencies in the mask is replicated on the surface of the wafer to provide access means for integrating corresponding circuitry with the semiconductor material of the wafer.

With increased density of the integrated circuitry, portions of the pattern in the mask may require dimensions in the order of one micrometer or less. However, ultraviolet light is diffraction limited in this range. Consequently, an ultraviolet light source is not suitable for resolving portions of the pattern having dimensions less than one micrometer. Therefore, in order to avoid the effects of diffraction, soft X-ray lithography systems have been developed in the prior art to provide the higher resolution required for replication of mask patterns having dimensions less than one micrometer.

These soft X-ray photolithography systems of the prior art usually include an X-ray tube having an envelope wherein an electron emitting cathode is disposed to beam electrons onto a focal spot area of soft X-ray emissive target material, such as aluminum, for example. However, the resulting K alpha X-rays emitted by the aluminum target material have an energy value of less than fifteen hundred electron volts, which is barely sufficient for passing through an excessively thin window in the tube envelope and through the transparent portions of the shadow mask to activate the selected portions of the photoresist film. Furthermore, aluminum exhibits an undesirably high vapor pressure at relatively low operating temperatures, such as one thousand degrees Centigrade, for example. Consequently, the instantaneous temperature of the focal spot area is maintained at a considerably lower value by limiting the incident electron energy, which also limits the intensity of the soft X-rays emanating from the focal spot area. As a result, the exposure time required to activate the selected portions of the photoresist film is relatively long, such as about ten minutes, for example, and is unsuitable for the manufacture of microelectronic devices.

Therefore, it is advantageous and desirable to provide a soft X-ray lithography system with source means for producing a beam of soft X-rays having sufficient energy and intensity to expose selected portions of an X-ray sensitive film on a workpiece in a time interval suitable for production techniques.

SUMMARY OF THE INVENTION

Accordingly, this invention provides a soft X-ray photolithography system including an X-ray tube having a sealed, evacuated envelope wherein an electron emitting cathode is disposed to beam electrons onto an aligned focal spot area of an anode target material comprised of titanium carbide. Preferably, the titanium carbide target material is annularly disposed as a focal track layer on a sloped peripheral surface of an axially rotatable anode disc. Thus, the anode disc is rotated to move successive segments of the titanium carbide focal track through a focal spot area thereof aligned with the electron emitting cathode.

The anode disc, preferably, is made of a lightweight material having high heat capacity, such as graphite, for example which may be provided with a coating of thermal emissive material, such as silicon carbide, for example. The envelope may be made of vitreous or metallic material, and is provided with a window of soft X-ray transparent material, such as beryllium material preferably having a thickness of five to ten thousandths of an inch, for example.

Disposed externally of the tube and aligned with the window is a shadow mask, which may comprise a sheet of soft X-ray transparent material, such as beryllium having a thickness of about five micrometers, for example, and having disposed on selected portions thereof a soft X-ray absorbent material, such as gold having a thickness of greater than one-half a micrometer, for example. Aligned with the mask is a film of soft X-ray sensitive material, such as poly[butane-1 sulfone], for example, on a surface of a workpiece, such as a semiconductor wafer, for example.

In operation, a suitable voltage, such as thirty to forty-five thousand volts, for example, may be applied between the cathode and the anode target to beam electrons from the cathode onto the focal spot area of the titanium carbide focal track with sufficient energy to generate characteristic K alpha X-rays of titanium. The titanium characteristic K alpha X-ray have an energy of about forty-five hunderd electron volts, as compared to aluminum characteristic K alphas X-rays which have an energy of less than fifteen hundred volts. Consequently, the titanium characteristic K alpha X-rays pass readily in a beam through a beryllium window having thickness of five thousand of an inch which absorbs about thirteen percent of the X-ray flux as compared to ninety-eight percent of the flux in a beam of aluminum characteristic K alpha X-rays. Therefore, the titanium characteristic K alpha X-rays passing through transparent portions of the shadow mask have sufficient intensity to activate aligned portions of the X-ray sensitive film on the workpiece in a shorter time interval, such as less than two minutes, for example, than required for the aluminum characteristic K alpha X-rays.

Also, in contrast to aluminum, the titanium carbide material of the focal track has a melting point of about thirty-one hundred degrees Centigrade and excellent thermal properties. Further, the thermal properties of the titanium carbide focal track would be enhanced by the high thermal capacity of the graphite substrate disc having a thermal emissive coating for radiating heat to the envelope which may be fluid-cooled, if desired. Consequently, a strong electron current, such as five hundred to seven hundred milliamperes, for example, impinge on the focal spot area of the titanium carbide focal track. As a result, the beam of titanium K alpha X-rays, after passing through the beryllium window and the transparent portions of the mask, will still have a correspondingly high intensity for replicating the pattern of the mask on the X-ray sensitive film in an exposure time interval of less than two minutes.

BRIEF DESCRIPTION OF THE DRAWING

For a better understanding of the invention, reference is made in the following more detailed description of the drawing wherein:

FIG. 1 is a soft X-ray photolithographic system embodying an X-ray tube of this invention.

DESCRIPTION OF THE PREFERRED EMBODIMENT

Referring to the drawing, FIG. 1 shows a soft X-ray photolithography system 10 including an X-ray tube 12 having an evacuated and sealed envelope 14 which is made of dielectric vitreous material, such as glass, for example, and is provided with a neck end portion 16. At one end of tube 12, the neck end portion 16 is peripherally sealed to an externally protruding end portion of an anode terminal 18 which has an inner end portion attached to a stationary conductive post 20. The post 20 bearingly supports in a well-known manner an encircling rotor 22 of a magnetic induction type motor. Rotor 22 is axially disposed within neck end portion 16 for rotation by an external stator (not shown) which encircles the neck end portion of envelope 14.

The rotor 22 extends out of an opposing open end of neck end portion 16 which is peripherally sealed to an encircling annular wall portion 24 of the envelope. Wall portion 24 extends radially outward from the neck end portion 16 and has an outer periphery sealed to one end of an axially extending wall portion 26 of the envelope. The other end of wall portion 26 is sealed to an outer peripheral portion of a solid circular wall portion 28 which closes a resulting larger diameter end portion of envelope 14.

The inner end of rotor 22 extending into the larger diameter end portion of envelope 14 is closed and attached to an axially extending stem 30 made of electrically conductive material, such as molybdenum, for example. Stem 30 generally is provided with a heat restrictive cross-sectional configuration and is provided with a radially extended flange 32 which supports a transversely disposed, anode target disc 34. A threaded end portion of stem 30 extends through a central aperture (not shown) in disc 34 and is engaged by a hex nut 36 to mechanically and electrically attach the disc to stem 30. Thus, the disc 34 is axially rotated by the rotor 22, and is electrically connected through the bearings thereof to the anode terminal 18.

Disc 34 is provided with a relatively broad peripheral surface 38 which is sloped such that the disc surface adjacent flange 32 has a larger diameter than the disc surface adjacent hex nut 36. The surface 38 preferably is sloped at a thirty to sixty degree angle with respect to a line drawn parallel to the axial centerline of the disc and measured clockwise therefrom. Disposed on the sloped surface 38 is an annular focal track layer 40 of titanium carbide material which emits characteristic K alpha X-rays having an energy of about forty-five hundred electron volts and a wavelength of about two and three quarter angstroms. Thus, the entire target disc 34 may be made of titanium carbide. However, it is preferred that the target disc 34 be made of relatively lightweight material having high heat capacity, such as graphite, for example, and have surface areas thereof outside of the focal track layer 40 provided with a thin coating 42 of high thermal emissive material, such as silicon carbide, for example. Alternatively, the entire graphite substrate disc 34 may have all surface areas provided with the thin coating 42 of high thermal emissive material prior to depositing the focal track layer 40 on the peripheral surface of the coated target disc. The material of coating 42 and the titanium carbide material of focal track layer 40 are mechanically and thermally bonded to the material of substrate disc 34 by suitable means, such as chemical vapor deposition, for example.

A focal spot area 44 of focal track layer 40 is radially aligned with an electron emitting cathode 46 which may comprise an electrically heated filament 48 insulatingly disposed in a conformingly shaped cavity of a conductive focusing cup 50. Opposing end portions of filament 48 are electrically connected to respective terminal conductors 52 and 54 which extend hermetically, as by means of respective dielectric bushings 56 sealed in cup 50, for example, out of the envelope 14. Thus, the conductors 52 and 54, respectively, may be connected to a suitable power supply (not shown) for heating the filament 48 to a desired electron emitting temperature. The cup 50 is sealed by well-known means in the axially extending wall portion 26 of envelope 14 and may be connected to an external conductor 58 which provides means for maintaining the cup at an electron focusing potential with respect to the potential of filament 48.

Also, in operation, an external high voltage source (not shown) may have respective polarized terminals connected to the anode terminal 18 and one of the filament terminal conductors, 52 or 54, for electrostatically beaming high energy electrons from the cathode 46 onto the focal spot area 44 of focal track layer 40. Preferably, the voltage applied between the anode terminal 18 and the cathode 46 is between thirty and forty-five thousand volts to provide the electrons impinging on focal spot area 44 with sufficient energy for generating titanium characteristic K alpha X-rays in the underlying titanium carbide material of the focal track layer 40. The rotor 22 is magnetically actuated to rotate the target disc 34 at a desired angular velocity for moving successive segments of focal track layer 40 through the focal spot area 40 thereof aligned with the electron emitting cathode 46.

As a result, titanium characteristic K alpha X-rays emanate from the focal spot area 44 and pass in a beam 60 through an axially aligned window 62 sealed by well-known means in the wall portion 28 of envelope 14. The window 62 is made of beryllium material which, preferably, is provided with a thickness between five and ten thousands of an inch in the direction of beam travel to permit the passage of about eighty-five percent of the soft X-rays in the beam. Disposed in spaced alignment with the window 62 is a shadow mask 64 comprising a sheet of soft X-ray transparent material, such as beryllium having a thickness between one and ten thousands of an inch, for example, to provide soft X-ray transparent areas 66. Selected portions of the soft X-ray transparent sheet are plated with soft X-ray opaque material, such as gold having a thickness of about one micrometer, for example, to provide it with areas 68 which absorb soft X-rays from the beam 60.

The soft X-ray opaque areas 68 may be spaced so closely together that the interposed soft X-ray transparent areas 66 may have respective width dimensions of the order of about one micrometer or less. However, since the titanium characteristic K alpha X-rays have wavelengths of about two and three-quarter angstroms, these soft X-rays pass readily through the transparent areas 66 of mask 64 without exhibiting adverse effects of diffraction and replicate the pattern of the transparent area 66 on aligned portions of a photoresist film 70. The film 70 comprises a material sensitive to soft X-rays, such as poly[butane-1 sulfone], for example, and is deposited on a surface of a workpiece, such as semiconductor wafer 72, which is aligned with the mask 64. Therefore, portions of film 70 are activated by the beam 60 passing through transparent areas 66 of the mask 64 in an exposure time interval of less than two minutes due to the large percentage of soft X-ray flux transmitted through the beryllium window 62.

Since the soft X-rays characteristic of carbon do not have sufficient energy to egress from tube 12, the soft X-rays in beam 60 comprise K alpha X-rays characteristic of the titanium component of the focal track layer 40. These soft X-rays in beam 60 are obtained without using a target material of pure titanium which has a lower melting point than titanium carbide. Further, since titanium carbide has a melting point of about thirty-one hundred degrees Centigrade and excellent thermal properties, as compared to prior art aluminum focal track material, a relatively greater electron density may be focused on the focal spot area 44 to produce a correspondingly greater intensity of soft X-ray flux in the beam 60. Further, the excellent thermal properties of titanium carbide are enhanced by the high thermal capacity of the graphite substrate disc 34 absorbing heat from the focal track layer 40. The heat, thus absorbed, may be rapidly dissipated by radiation to the envelope 14, which may be fluid-cooled. This radiation of heat from the target disc 34 to the envelope 14 may be further enhanced by providing the graphite substrate disc 34 with the coating 42 of thermal emissive material. Accordingly, the anode target of tube 12 has the capacity for handling high power levels, such as five to thirty kilowatts, for example, to provide the beam 60 with a desired soft X-ray intensity and to achieve a preferred exposure time interval.

From the foregoing, it will be apparent that all of the objectives of this invention have been achieved by the structures shown and described herein. It also will be apparent, however, that various changes may be made by those skilled in the art without departing from the spirit of the invention as expressed in the appended claims. It is to be understood, therefore, that all matter shown and described is to be interpreted as illustrative and not in a limiting sense.

What is claimed is:

1. An X-ray lithography method comprising the steps of:
    disposing an X-ray source having a target made of a chemical compound material for emitting X-rays characteristic of the elements in said compound along a predetermined path;
    disposing in said path a filter made of material transmissive to X-rays characteristic of only one of said elements;
    disposing in alignment with said filter a mask having a portion transmissive to X-rays characteristic of said only one of said elements; and
    disposing in alignment with said portion of the mask a workpiece having a surface portion coated with a material sensitive to X-rays characteristic of said only one of said elements.

2. An X-ray lithography method comprising the steps of:
    disposing an X-ray source having a target made of chemical compound material for emitting a beam of desired characteristic X-rays having energy levels in the order of forty-five hundred electron volts and other characteristic X-rays having energy levels substantially less than forty-five hundred electron volts;
    disposing in said beam a mask having a portion transmissive to said desired characteristic X-rays; and
    disposing a workpiece having a surface portion coated with a material sensitive to said desired characteristic X-rays in alignment with said portion of the mask.

3. An X-ray lithographic method comprising the steps of:
    disposing an X-ray source for emitting X-rays characteristic of titanium along a predetermined path;
    disposing in said path a mask having a portion transmissive of X-rays; and
    disposing a workpiece having a surface portion coated with a layer of material sensitive to said X-rays in alignment with said portion of the mask.

4. An X-ray lithography system comprising:
    X-ray means including an X-ray emissive target made of a chemical compound material having a plurality of elements chemically bound to one another for directing emitted X-rays characteristic of said elements along a predetermined path, one of said elements emitting characteristic X-rays having respective wavelengths between two and three angstroms;
    a mask disposed in said path and having an X-ray transmissive portion; and
    workpiece means having a surface portion coated with X-ray sensitive material and disposed in alignment with said portion of the mask for receiving X-rays passed through said portion.

5. An X-ray lithography system as set forth in claim 4 wherein said X-ray source means includes an electron source disposed for directing electrons onto said target and generating said X-rays characteristic of said elements in the target material.

6. An X-ray lithography system as set forth in claim 5 wherein said chemical compound material has a melting temperature greater than three thousand degrees Centigrade.

7. An X-ray lithographic system as set forth in claim 5 wherein said X-ray source comprises an X-ray tube having an evacuated envelope wherein said target and said electron source are disposed in spaced relationship and said envelope includes a window portion made of material substantially transparent to X-rays characteristic of said one of said elements and substantially absorbent to X-rays characteristic of another one of said elements.

8. An X-ray lithographic system as set forth in claim 7 wherein the X-rays characteristic of said other one of the elements have respective wavelengths substantially longer than three angstroms.

9. An X-ray lithography system comprising:
    X-ray source means for emitting a beam of X-rays having energy values in the order of forty-five hundred electron volts and including an X-ray emissive target made of chemical compound material having at least two elements chemically bound to one another, one of said elements emitting characteristic X-rays having respective energy values in the order of forty-five hundred electron volts and the other of said elements emitting characteristic X-rays having energy values substantially less than forty-five hundred electron volts, and filter means disposed with respect to said target for permitting passage of said X-rays having energy values in the order of forty-five hundred electron volts;

a mask disposed in said beam and having an X-ray transmissive portion; and workpiece means having a surface portion coated with X-ray sensitive material and disposed in alignment with said portion of the mask for receiving X-rays passed through said portion.

10. A soft X-ray lithography system comprising:
a soft X-ray tube having an evacuated envelope provided with a window made of soft X-ray transmissive material;

an anode target having a soft X-ray emissive surface made of titanium carbide material and disposed within the envelope in alignment with the window;

electron emitting cathode means spaced from the soft X-ray emissive surface in the envelope for directing electrons onto the surface and generating soft X-rays which pass in a beam through the window;

a workpiece disposed externally of the tube and having an adjacent surface portion disposed in spaced alignment with the window;

a film of soft X-ray sensitive material disposed on the surface portion of the workpiece; and a shadow mask disposed between the window and the film; the mask having a pattern of soft X-ray transparent portions and interposed soft X-ray opaque portions.

11. A soft X-ray lithography system as set forth in claim 10 wherein the anode target comprises a rotatable disc having an outer peripheral surface made of titanium carbide material.

12. A soft X-ray lithography system as set forth in claim 10 wherein the mask comprise a sheet of soft X-ray transparent material having soft X-ray opaque portions.

13. A soft X-ray lithography system as set forth in claim 10 wherein the window is made of beryllium material.

14. A soft X-ray lithography system as set forth in claim 13 wherein the beryllium material has a thickness of five to ten thousands of an inch.

* * * * *